United States Patent
Zografos et al.

(10) Patent No.: US 10,439,616 B2
(45) Date of Patent: Oct. 8, 2019

(54) WAVE-BASED MAJORITY GATE DEVICE

(71) Applicants: IMEC VZW, Leuven (BE); Katholieke Universiteit Leuven, Leuven (BE)

(72) Inventors: Odysseas Zografos, Leuven (BE); Bart Soree, Begijnendijk (BE); Florin Ciubotaru, Heverlee (BE); Hanns Christoph Adelmann, Wilsele (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 1 day.

(21) Appl. No.: 15/849,372

(22) Filed: Dec. 20, 2017

(65) Prior Publication Data

US 2018/0175863 A1  Jun. 21, 2018

(30) Foreign Application Priority Data

Dec. 21, 2016  (EP) .................................. 16205639

(51) Int. Cl.
| | | |
|---|---|---|
| *H03K 19/23* | (2006.01) | |
| *G06F 1/04* | (2006.01) | |
| *H03K 19/168* | (2006.01) | |
| *G01R 33/12* | (2006.01) | |
| *G01R 33/18* | (2006.01) | |

(52) U.S. Cl.
CPC ......... *H03K 19/23* (2013.01); *G01R 33/1284* (2013.01); *G01R 33/18* (2013.01); *G06F 1/04* (2013.01); *H03K 19/168* (2013.01)

(58) Field of Classification Search
None
See application file for complete search history.

(56) References Cited

U.S. PATENT DOCUMENTS

| | | | | |
|---|---|---|---|---|
| 8,063,460 B2 * | 11/2011 | Nikonov | ................ | B82Y 25/00 257/421 |
| 8,450,818 B2 * | 5/2013 | Nikonov | ................ | B82Y 25/00 257/421 |

(Continued)

FOREIGN PATENT DOCUMENTS

| | | | | |
|---|---|---|---|---|
| EP | 3035347 A1 * | 6/2016 | ............. | H01L 43/02 |
| WO | WO 2015147807 A1 * | 10/2015 | ............. | H01L 43/08 |

*Primary Examiner* — Dion Ferguson
*Assistant Examiner* — Srinivas Sathiraju
(74) *Attorney, Agent, or Firm* — Knobbe, Martens, Olson & Bear LLP

(57) ABSTRACT

The disclosed technology generally relates to computation devices, and more particularly to majority gate devices configured for computation based on spin waves. In one aspect, a majority gate device comprises cells that are configurable as spin wave generators or spin wave detectors. The majority gate device comprises an odd number of spin wave generators, and at least one spin wave detector. The majority gate device additionally comprises a waveguide adapted for guiding spin waves generated by the spin wave generators. The spin wave generators and the at least one spin wave detector are positioned in an inline configuration along the waveguide such that, in operation, interference of the spin waves generated by the spin wave generators can be detected by the at least one spin wave detector. The interference of the spin waves corresponds to a majority operation of the spin waves generated by the spin wave generators.

12 Claims, 5 Drawing Sheets

(56) References Cited

U.S. PATENT DOCUMENTS

| | | | |
|---|---|---|---|
| 8,697,454 B2* | 4/2014 | Nikonov | B82Y 25/00 |
| | | | 257/422 |
| 9,947,860 B2* | 4/2018 | Min | H01L 43/02 |
| 9,979,401 B2* | 5/2018 | Pan | H01L 27/222 |
| 2008/0231392 A1* | 9/2008 | Kim | G11C 13/06 |
| | | | 333/147 |
| 2010/0321993 A1* | 12/2010 | Nikonov | B82Y 25/00 |
| | | | 365/171 |
| 2011/0147816 A1* | 6/2011 | Nikonov | B82Y 25/00 |
| | | | 257/295 |
| 2012/0038387 A1* | 2/2012 | Nikonov | B82Y 25/00 |
| | | | 326/35 |
| 2012/0217993 A1* | 8/2012 | Nikonov | B82Y 25/00 |
| | | | 326/35 |
| 2013/0256818 A1* | 10/2013 | Nikonov | B82Y 25/00 |
| | | | 257/421 |
| 2016/0172581 A1* | 6/2016 | Min | H01L 43/02 |
| | | | 257/421 |
| 2017/0069831 A1* | 3/2017 | Nikonov | H01L 43/08 |
| 2017/0076772 A1* | 3/2017 | Andrikopoulos | G11C 11/1673 |
| 2017/0179373 A1* | 6/2017 | Swerts | H01L 27/22 |
| 2018/0061970 A1* | 3/2018 | Vaysset | B82Y 10/00 |
| 2018/0248553 A1* | 8/2018 | Pan | H01L 27/222 |
| 2018/0248554 A1* | 8/2018 | Pan | H01L 27/222 |

* cited by examiner

WAVE-BASED MAJORITY GATE DEVICE

CROSS-REFERENCE TO RELATED APPLICATIONS

This application claims foreign priority to European Patent Application No. EP 16205639.4, filed on Dec. 21, 2016, the content of which is incorporated by reference herein in its entirety.

BACKGROUND

Field

The disclosed technology generally relates to computation devices, and more particularly to majority gate devices configured for computation based on spin waves.

Description of the Related Technology

For computation using devices beyond CMOS-based devices, there has been an effort to explore and utilize alternative information carriers (e.g., other than electrons/charge). Some of the non-charge-based concepts utilize wave entities, e.g., non-classical electromagnetic waves, as their information carriers, where the information is encoded in the phase, amplitude, or frequency of the wave. Examples of these concepts include spin wave-based logic technologies and plasmonic wave-based logic technologies.

Some wave-based logic technologies utilize a majority gate. In some implementations of a majority gate, three waves are interfered and the interference result is the majority of the three initial waves (e.g., interference of two waves with phase '0' and one wave with phase 'pi' will result in a wave with phase '0' which corresponds with the majority of the initial waves). Some wave-based majority gates have a fork-like structure, which consist of three waveguides which act as inputs and serves to guide the input waves to an interference region, and subsequently output wave propagates to an output waveguide.

An example of a prior art wave based majority gate 100 is shown in FIG. 1. In this example, three input waveguides 132, 134, 136 are connected in a trident configuration. As illustrated in the left drawing, antennas 112, 114, 116 for generating spin waves are positioned in each of the three input waveguides 132, 134, 136. A fourth waveguide, the output waveguide 138, is connected to the central point of the trident configuration. A receiving antenna 118 for receiving a spin wave is positioned in the output waveguide 138. The operation is illustrated in the right drawing. Spin waves 142, 144, 146 are generated by the antennas 112, 114, 116, respectively, in the input waveguides 132, 134, 136, respectively. These spin waves interfere in the interference region 145 where the three input waveguides are connected. A resulting spin wave 148 propagates in the output waveguide 138 towards the receiving antenna 118. One spin wave 142 of the generated spin waves may for example have a phase π, while the other spin waves 144, 146 in the input waveguides may have a phase 0. As a result of the majority gate operation the resulting spin wave 148 will have a phase 0.

According to various embodiments disclosed herein, majority gate devices are improved, e.g., with respect to their density and computation capability.

SUMMARY OF CERTAIN INVENTIVE ASPECTS

It is an object of embodiments of the disclosed technology to provide good spin wave based majority gate devices. It is an advantage of embodiments of the disclosed technology that they are area and energy efficient.

The above objective is accomplished by a method and device according to the disclosed technology.

In a first aspect, embodiments of the disclosed technology relate to a majority gate device comprising a plurality of cells. The cells are configurable as spin wave generators or spin wave detectors, such that the majority gate device comprises: an odd number of spin wave generators, wherein the number of spin wave generators is at least 3, and at least one spin wave detector. The majority gate device further comprises a waveguide adapted for guiding spin waves generated by the spin wave generators. The spin wave generators and the at least one spin wave detector are positioned in an inline configuration along the waveguide such that, in operation, interference of the spin waves generated by the spin wave generators can be detected by the at least one spin wave detector thereby obtaining a signal which corresponds with a majority operation on the generated spin waves.

It is an advantage of embodiments of the disclosed technology that the footprint area occupied by the majority gate devices is reduced compared to prior art majority gate devices, such as the device described above with respect to FIG. 1, which may have a trident shape. The reduction in the device footprint area is that the spin wave generators and the at least one spin wave detector are arranged in an inline configuration along the waveguide.

In some embodiments of the disclosed technology, the waveguide is a straight waveguide. Where in embodiments of the disclosed technology reference is made to the majority operation on the generated spin waves reference is made to an operation in which the at least 3 spin waves are combined together and the majority result is obtained (e.g., interfering two waves with phase '0' and one with phase 'pi' will result in a wave with phase '0'). In embodiments of the disclosed technology the signal obtained by the spin wave detector is independent of the initial state of the spin wave detector. In embodiments of the disclosed technology, the majority gate device is configured such that, in operation, a majority or a maximum of the interference pattern occurs at the spin wave detector.

It is an advantage of embodiments of the disclosed technology that an inline configuration is more scalable and compatible with lithography processes. It will be appreciated that simple line structures are among the most lithography-friendly structures, e.g., in terms of needing less optical proximity corrections, being able to print smallest feature sizes for a given wavelength of light, and having less distortions compared to the corresponding features in the reticle. This has moreover the advantage that the majority gate devices can be positioned parallel with each other and/or positioned closer to each other in a more compact manner, which is an improvement over some prior art device, e.g., trident shaped majority gate devices illustrated in FIG. 1, which may have acute angles between the waveguides connected between the input cells and the interference region. It is an advantage of embodiments of the disclosed technology that the input waves, generated by the spin wave generators, propagate with minimum or reduced losses to the spin wave detector, compared with some prior art devices, e.g., trident shaped majority gate devices illustrated in FIG. 1. It is an advantage of embodiments of the disclosed technology that the generated input waves propagate with minimum losses and completely matching wave-vectors to the output. It is an advantage of embodiments of the disclosed technology that the spin wave generators are arranged along a line, which enables wave interference with matching wave vectors while minimizing losses. Another advantage of the inline configuration is that it is possible to change the function of some cells to spin wave detectors and of some other cells to spin wave generators and still obtain a majority gate device, unlike some prior art majority gate devices, e.g., trident shaped majority gate devices illustrated in FIG. 1, wherein the cells for generating the spin waves and the cells for detecting the spin waves may be the same cells.

In embodiments of the disclosed technology, at least some of the cells are magneto-electric cells.

It is an advantage of embodiments of the disclosed technology that the magneto-electric cells can be used as spin wave generator and as spin wave detector. It is an advantage of embodiments of the disclosed technology that magneto-electric cells allow for improved integration into a circuit than, for example, antennas. It is an advantage that the magneto-electric cells can be operated by a voltage. In antennas, on the contrary, the effect of the antenna is given by the absolute current. This implies that the current density increases for decreasing wire sizes.

In embodiments of the disclosed technology, when the cells comprise magneto-electric cells, the cells have a memory function related to the spin up or spin down state.

In embodiments of the disclosed technology, at least some of the cells are magnetic tunnel junctions (MTJs). Some MTJs include a magnetic free layer and a magnetic fixed layer that are interposed by a tunnel barrier. For example, the magnetic layers may comprise CoFeB and the tunnel barrier may comprise MgO. The magnetic layers may have magnetic anisotropy directions that are perpendicular or parallel to the plane of the magnetic layers.

In embodiments of the disclosed technology magnetic tunnel junctions may be configured as spin wave generator or as spin wave detector. It is an advantage that these spin wave generators are operated by current density as this allows to scale or miniaturize the majority gate device. Miniaturisation of antennas, on the other hand, may be difficult because they are operated by current, and scaling the dimensions for the same amount of current may result in unacceptably high current.

A magnetic tunnel junction (can be both a generator and a detector) may generate a spin wave by a spin torque effect or it may detect spin waves by measuring tunnelling magneto-resistance (TMR).

When these cells obtain a signal corresponding with a certain interference of the spin waves, they will remain in a specific state for a certain amount of time. It is thereby an advantage that re-generation is not required. By reapplying the voltage the same signals are generated.

It is an advantage of embodiments of the disclosed technology that the cells (e.g., magnetic tunnel junctions, magneto-electric cells) are non-volatile. This is advantageous over an antenna, which may not be non-volatile.

In embodiments of the disclosed technology, some of the cells may be magnetic tunnel junctions and some of the cells may be magneto-electric cells.

In embodiments of the disclosed technology, at least two cells are configurable as spin wave detectors.

This means that such a majority gate device with two spin wave detectors can be used to implement majority gates with a fan-out of two. It is an advantage of embodiments of the disclosed technology that the bi-directionality of the spin waves is exploited. Since by default the wave signals propagate in both directions of the waveguide, two spin wave detectors can be positioned at opposite ends of the majority gate device. This means that such a majority gate device with two spin wave detectors can be used to implement two majority gates depending on the spin wave detector that is enabled to read/detect/store the majority signal (e.g., the signal that corresponds with a majority operation on the generated spin waves). It is an advantage of majority gate devices with two spin wave detectors that these devices have a fan out of two. This is particularly advantageous, in comparison with some prior art devices, e.g., trident shaped majority gate devices.

In a second aspect, embodiments of the disclosed technology relate to a circuit comprising a plurality of parallel majority gate devices in accordance with embodiments of the disclosed technology.

It is an advantage of embodiments of the disclosed technology that multiple majority gate devices can be combined in a regular and compact layout. The reason therefore being that the waveguides, the spin wave detectors, and the at least one spin wave generator are positioned in an inline configuration, for reasons described above. The regular layout can for example be a grid.

In embodiments of the disclosed technology the circuit comprising a plurality of cells organized in rows and columns, wherein at least part of the cells are interconnected using waveguides and wherein at least some of these interconnected cells are forming majority gate devices in the row and/or column direction.

In embodiments of the disclosed technology the majority grate devices may be organised in an array or a grid of horizontal and vertical columns. In embodiments of the disclosed technology the spin wave detectors and generators are cells which can detect/generate spin waves in two directions which are orthogonal to each other. It is an advantage of these spin waves generators and detectors that they can be used to form a grid. Such a grid may comprise horizontal and/or vertical majority gate devices. Each one of such horizontal or vertical majority gate devices may have a fan out of two. It is an advantage of embodiments of the disclosed technology that a regular grid comprising horizontal and/or vertical majority gate devices can be made, which may provide fabrication advantages. In embodiments of the disclosed technology, the cells in the grid may be configurable as spin wave generators or as spin wave detectors. It is thereby an advantage of embodiments of the disclosed technology that the cells of the grid are flexible in terms of input and output. The interconnected cells of the grid not necessarily always function as part of a majority gate device. They can for example also function as buffers or inverters.

In a third aspect, embodiments of the disclosed technology relate to a clocking system for clocking the cells of a majority gate device or of a circuit in accordance with embodiments of the disclosed technology. The clocking system comprises at least one first component adapted for clocking the cells of the majority gate device. Some of the cells are clocked to generate spin waves such that they interfere in the majority gate device after propagating through the waveguide. One or more other cells are clocked to receive the interference of the spin waves. The clocking system is configured to control execution of logic functions by means of the at least one first component.

In embodiments of the disclosed technology, the first component of the clocking system takes into account the delays in the majority gate device when clocking the cells which function as spin wave generators or spin wave detectors, such that an optimal interference at the spin wave detectors is obtained when detecting the signal with a spin wave detector. The delays in the majority gate device depend on the positioning of the at least one spin wave detector and the spin wave generators in the inline configuration along the waveguide. In embodiments of the disclosed technology the cells are clocked by the at least one first component of the clocking system in such a way that the interference is a majority interference which can be detected by a cell operated as spin wave detector. It is an advantage of embodiments of the disclosed technology that the clocking system can be configured such that logic functions can be implemented in the circuit. This can be done by clocking the cells such that a majority gate operation is obtained.

In embodiments of the disclosed technology, where the circuit comprises a grid of cells, the clocking system is adapted for shifting the majority gate in the circuit. The clocking system may be adapted for configuring the cells as spin wave generators or as spin wave detectors.

In embodiments of the disclosed technology, where the circuit comprises a grid of cells, the clocking system may be adapted for clocking the cells in the grid column by column and row by row. Embodiments, however, are not limited thereto.

In embodiments of the disclosed technology combinations of cells can be enabled or disabled. It is thereby an advantage of embodiments of the disclosed technology that by using a clocking system according to the disclosed technology sneak paths can be controlled. The clocking system may for example not clock specific cells. If a cell is not clocked, it cannot detect a spin wave.

In embodiments of the disclosed technology the clocking system comprises at least one second component adapted for clocking the cells such that a signal can propagate between different cells and/or such that a signal can be inverted and wherein the clocking system is configured to control execution of logic functions by means of the at least one first component and the at least one second component.

It is an advantage of embodiments of the disclosed technology that signals can be propagated from one cell to another cell. A signal can for example be the phase of a spin wave. The signal may be encoded in both the phase of the propagating wave and that state of the cell. The phase of the propagating wave and the state of the cell are related. The state of the cell may, for example, correspond to an up spin state, which state may relate to the creation or the detection of a signal with phase 0. The state of the cell may, for example, correspond to a down spin state, which s may relate to the creation or the detection of a signal with phase π. This is particularly advantageous when the cells are connected in a grid, since a signal can be propagated from any cell to any other cell. The signal can, for example, be propagated by hopping from one cell to another. The first component may control different majority gates and the second component may control different buffers. Such a buffer may comprise two cells and an interconnecting waveguide. In that case the first cell is the input and the second cell is the output. In such a buffer the final state of the output will be the same as the original state of the input.

In a fourth aspect, embodiments of the disclosed technology relate to a processing device or a processor comprising a majority gate device and/or a circuit in accordance with embodiments of the disclosed technology. The processing device moreover comprising a clocking system in accordance with embodiments of the disclosed technology.

It is an advantage of embodiments of the disclosed technology that a processing device can be realized by using majority gate devices according to the disclosed technology. It is an advantage of such a processing device that the power consumption is low because it is implemented by low power majority gate devices according to the disclosed technology.

In a fifth aspect, embodiments of the disclosed technology relate to a method of using a processing device, in accordance with embodiments of the disclosed technology, as a node in the internet of things.

It is an advantage of processing devices according to the disclosed technology that their low power consumption makes them particularly useful as processing nodes in the internet of things. This allows for example pre-processing of data before sending it, instead of sending the raw data.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
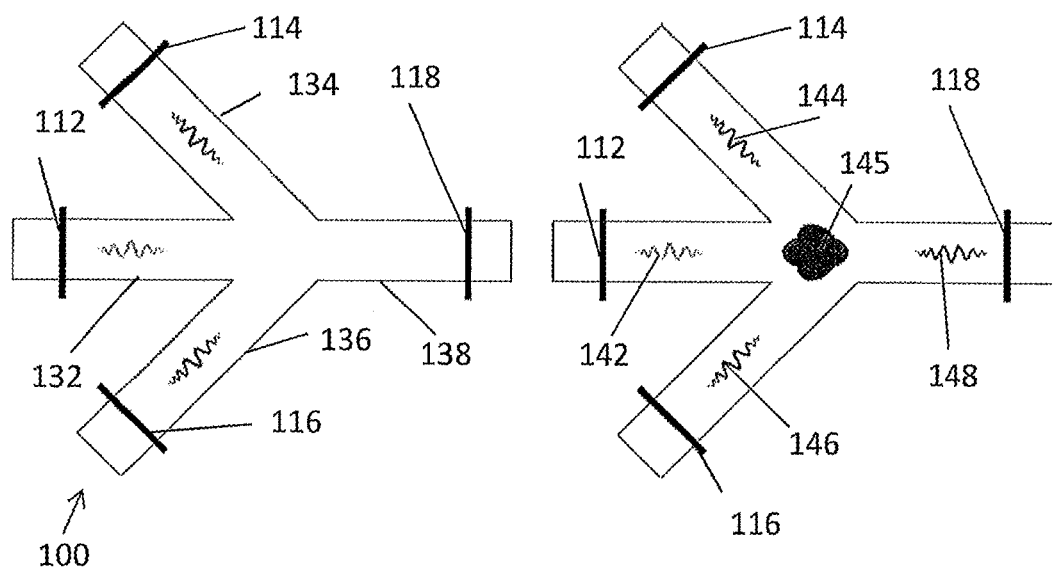
FIG. 1 shows a prior art wave-based majority gate device.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the disclosed technology a reference is made to a cell or cells, the reference refers to a portion or a subunit, which may be repeating, in any type of devices that can generate or detect spin waves.

Where in embodiments of the disclosed technology a reference is made to cells which are positioned in an inline configuration along the waveguide, the reference refers to cells which can be interconnected along a line along the waveguide without any branches.

Where in embodiments of the disclosed technology a reference is made to clocking (e.g., activating) the cells, the reference refers to clocking (i.e. activating) the cells to generate spin waves or clocking (i.e. activating) the cells to receive the interference of the spin waves.

In a first aspect, embodiments of the disclosed technology relate to a majority gate device comprising cells which are configurable as spin wave detectors or spin wave generators. The cells are incorporated along a waveguide in an inline configuration. They are positioned such that spin waves generated by an odd number (e.g., three or more) of the cells are interfering at the position of a receiving cell which allows to obtain the majority result. This inline arrangement enables all three input waves to propagate with minimum losses and completely matching wave-vectors to the output. This results in a successful majority operation with a reduced area footprint and no arms in acute angles.

In embodiments of the disclosed technology, the waves used as information carriers are spin waves generated by cells. These cells may be antennas, or structures based on spin injection (e.g., spin Hall effect), or more preferably magneto-electric cells or magnetic tunnel junctions.

In embodiments of the disclosed technology some of the cells may be structures for spin injection (SHE) configured, e.g., to inject spin-polarized electrons, some of the cells may be magnetic tunnel junctions (MTJ) configured, e.g., to tunnel spin-polarized electrons, and/or some of the cells may be magneto-electric (ME) cells configured to, e.g., convert a magnetic signal to an electrical signal and vice versa. Reading may for example be done by MTJ cells and spin wave generation by magneto-electric cells. Other cell configurations may be implemented according to the needs of the circuit which is build.

According to various embodiments, the cells comprise magnetic materials, and can store information based on the magnetic properties, which may be non-volatile. Cells may, for example, have spin up and spin down states, which can non-volatile to serve as memory states.

Figure 2:
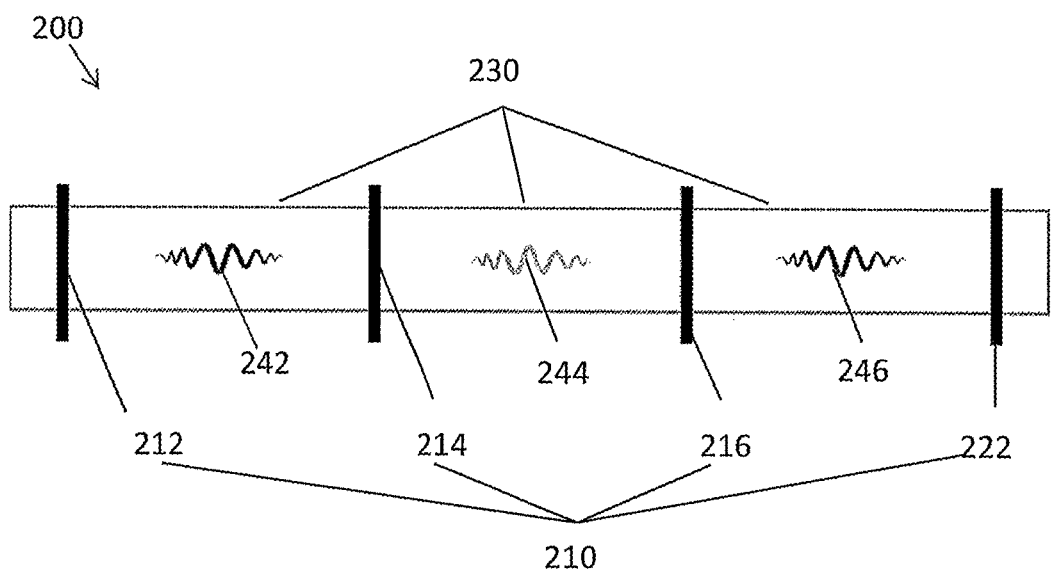
FIGS. 2 and 3 show a schematic drawing of a majority gate device in accordance with embodiments of the disclosed technology.

FIG. 2 shows a schematic drawing of a majority gate device 200 in accordance with embodiments of the disclosed technology. It shows a waveguide 230 and cells 210 positioned in an inline configuration along the waveguide 230. The waveguide 230 may include a plurality of different smaller waveguides (waveguides between two adjacent cells). In the illustrated embodiment, the cells 212, 214, 216 are configured as spin wave generators and the cell 222 is configured as a spin wave detector along a line, such that the majority gate device arranged in an inline configuration without having any branches. In this example, the operation of the majority gate device is illustrated. In one mode of operation, a first cell 212 transmits a first spin wave 242, a second cell 214 transmits a second spin wave 244, and a third cell 216 transmits a third spin wave 246. These spin waves are transmitted such that they interfere at a certain position along the waveguide 230. At this position a fourth cell 222 is located, which can detect the interference spin waves. The majority operation is detected by the receiving cell. By way of illustration, in one example, the first spin wave may have a phase 0, the second spin wave may have a phase $\pi$ and the third spin wave may have a phase 0. In this example, the majority operation will result in a spin wave with phase 0. In the example of FIG. 2 the spin waves are generated using spin wave generators 212, 214, 216 that may be configured as antennas, and detected using the spin wave detector 222, which may also be configured as an antenna.

In various illustrated embodiments, the majority gate devices are arranged in a straight line, it will be appreciated that embodiments are not so limited. That is, in some embodiments, an inline configuration as used herein can have curvatures or bends.

Figure 3:
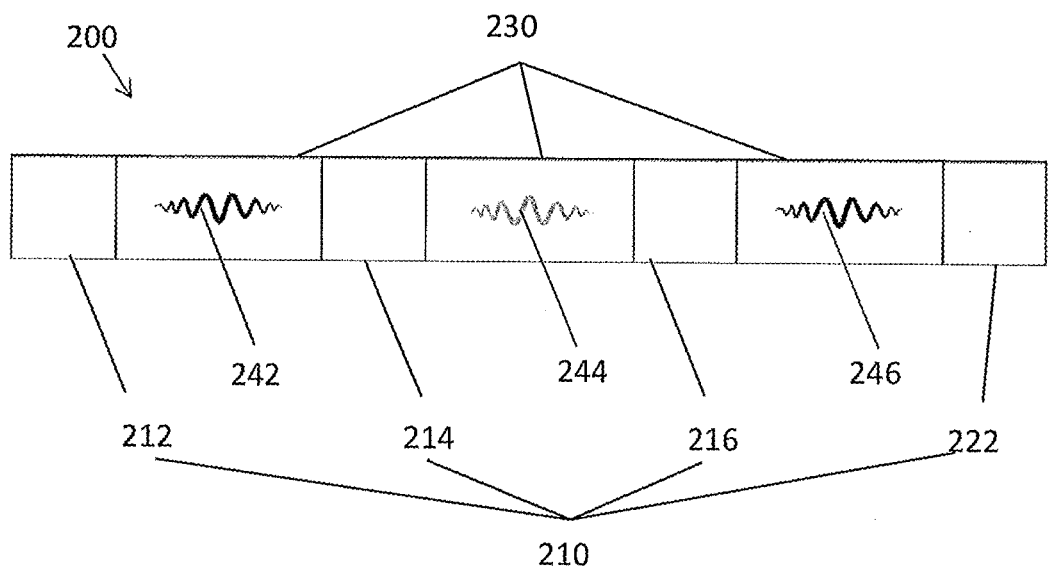

In FIG. 3, a majority gate device 200 including cells 210 that are configured differently than the cells in FIG. 2 are illustrated. These can, for example be magneto-electric cells or magnetic tunnel junctions or any type of cells which can detect or transmit spin waves. These cells 210 are arranged along a waveguide such that an inline configuration is obtained. Also in this example the first, second, and third cells 212, 214, 216 are configured to generate first, second, and third spin waves, which may interfere, and the interference is detected by a receiving cell 222.

Figure 4:
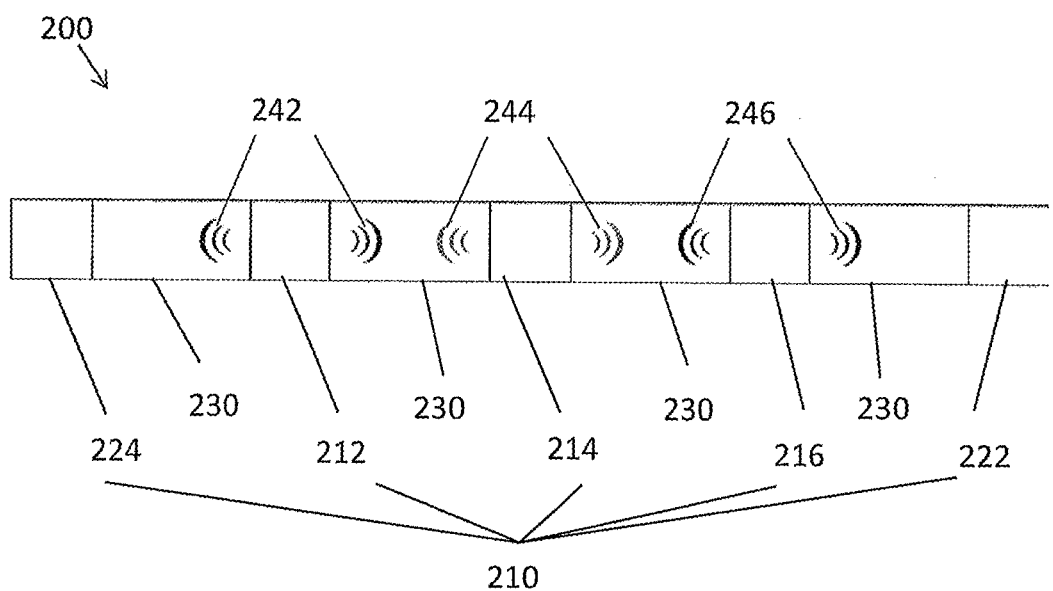
FIG. 4 shows a majority gate device with a fan-out of two in accordance with embodiments of the disclosed technology.

FIG. 4 shows a majority gate device 200 with a fan-out of two in accordance with embodiments of the disclosed technology. In this example the majority gate device comprises two outer cells 222, 224, which are configured as spin wave detectors, three inner cells 212, 214, 216, which are configured as spin wave generators, and a waveguide 230. The cells 210 are arranged along the waveguide 230 such that a majority device with an inline configuration of cells is obtained. The bidirectional first spin waves 242 are generated by the first cell 212 and move in two directions along the waveguide 230. Similarly, the second spin waves 244 generated by the second cell 214 and the third spin waves 246 generated by the third cell 216 are bidirectional spin waves. Because of their bi-directionality, the spin waves interfere at two positions in the waveguide 230. At these positions the spin wave detectors 222, 224 are located.

In a second aspect, embodiments of the disclosed technology relate to a circuit 500 comprising a plurality of majority gate devices 200. These majority gate devices may be parallel with each other.

In such a circuit the cells may be organized in rows and columns. At least part of these cells are interconnected using waveguides. Thereby majority gate devices may be formed. An advantage of such a configuration is that spin waves may propagate in the row direction and/or in the column direction.

Figure 5:
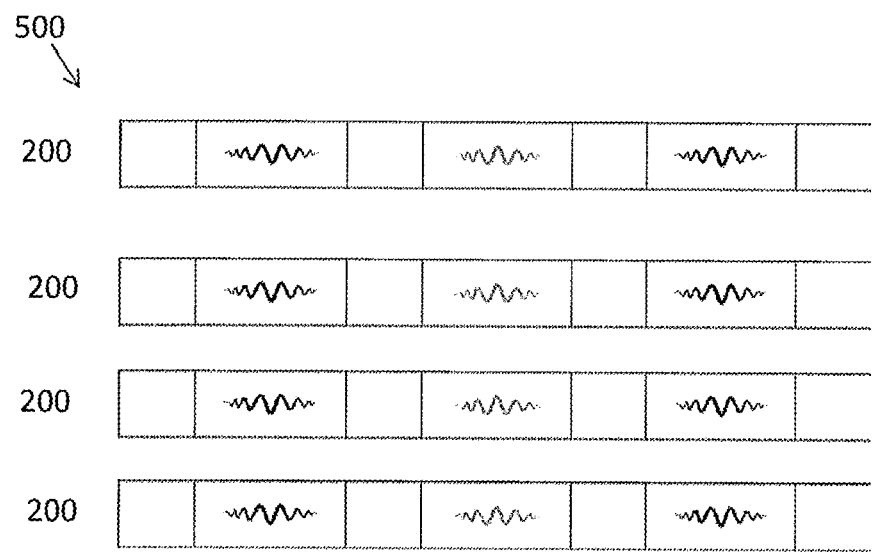
FIG. 5 is a schematic illustration of a circuit comprising a plurality of majority gate devices in accordance with embodiments of the disclosed technology.

FIG. 5 is a schematic illustration of a circuit 500 comprising a plurality of majority gate devices 200 in accordance with embodiments of the disclosed technology. In this example, the majority gate devices 200 are arranged to be parallel to each other and co-extend in substantially the same direction. The illustrated configuration is enabled in part by the inline configuration of the majority gate devices. It will be appreciated that the illustrated configuration having a regular and compact layout would have been difficult or impossible using some prior art majority gate devices, e.g., the device illustrated above with respect to FIG. 1 that is organized in a trident configuration.

In a circuit 500 which comprises a grid of cells, a whole grid of cells can be connected with waveguides. Thereby majority gate devices according to the disclosed technology can be created. These majority gate devices may have a fan out of two.

Figure 6:
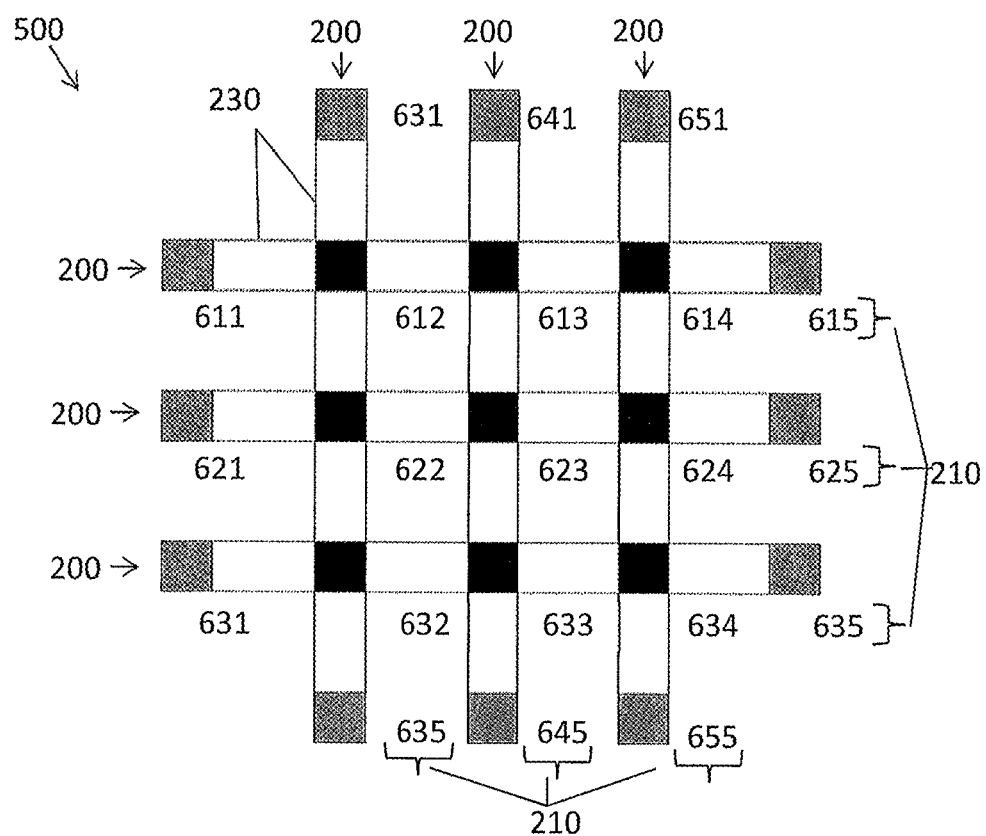
FIG. 6 is a schematic illustration of a circuit comprising a plurality of cells organized in rows and columns, in accordance with embodiments of the disclosed technology.

FIG. 6 is a schematic illustration of a circuit 500 comprising a plurality of cells 210 organized in rows and columns, in accordance with embodiments of the disclosed technology. In this example the cells 210 are interconnected in the row and in the column directions. The majority gate devices 200 include a first set of majority gate devices that are arranged to be parallel to each other and extend in a first direction, and a second set of majority gate devices that are arranged to be parallel to each other and extend in a second direction crossing the first direction. Thereby majority gate devices 200 are formed wherein cells are shared at the cross-points between the rows and columns of the majority gate devices. In this example three horizontal majority gate devices 200 are formed. The majority gate devices 200 include a first majority gate device comprising cells 611 to 615, a second majority gate device 200 comprising cells 621 to 625, and a third majority gate device comprising cells 631 to 635. The vertical majority gate devices 200 are sharing the cells with the horizontal majority gate devices. The first vertical majority gate device therefore uses shared cells 612, 622 and 632. The outer cells of this device are the cells 631, 635. The second vertical majority gate device therefore uses shared cells 613, 623 and 633. The outer cells of this device are the cells 641, 645. The third vertical majority gate device therefore uses shared cells 614, 624 and 634. The outer cells of this device are the cells 651, 655. In this circuit spin waves move both horizontally and vertically. If for example a signal is applied to the cell 612 a spin wave will be generated that will move upwards, downwards, left and right.

In a third aspect, embodiments of the disclosed technology relate to a clocking system 710 for clocking the cells 210 of a majority gate device in accordance with embodiments of the disclosed technology. This clocking system 710 comprises a first component 712 for initiating the spin waves and for detecting them such that the optimal interference moment is selected. This first component 712 controls the detection moment based on the initiating moment. Thereby it may take into account possible delays in the circuit 500 for defining the moments when the spin waves are generated and for defining the moments for detecting the interfering spin waves. In embodiments of the disclosed technology the clocking system 710 is configured to control execution of logic functions by means of the at least one first component 712.

When the cells 210 are organised in rows and columns, they may be clocked by the clocking system 710 row by row and column by column. Since cells in a circuit may be interconnected by different waveguides, signals may be transferred from one cell to the other cell by clocking the cells. This may be controlled by a second component 714 of the clocking system 710. The clocking system 710 may comprise logic cycles wherein majority gate operations are performed (implemented by the first component 712) and transfer cycles in which signals are transferred from one cell to another or wherein signals are inverted (implemented by the second component 714). Signals may also be ignored by not clocking the cell. In that case the spin wave passes by. Hence, sneak paths can be controlled by appropriate clocking of the cells of the circuit. In embodiments of the disclosed technology the clocking system 710 is configured to control execution of logic functions by means of the at least one first component 712 and the at least one second component 714.

Figure 7:
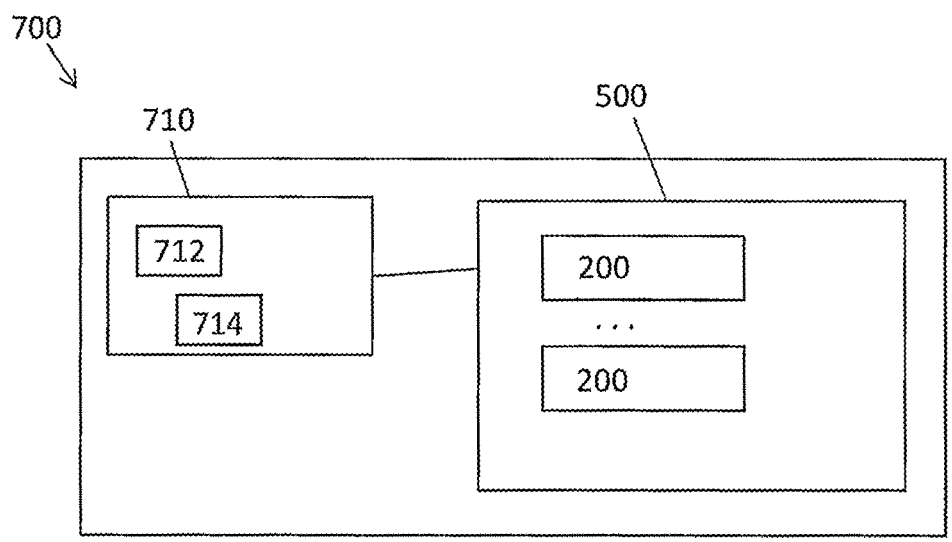
FIG. 7 shows the different components of a processing device in accordance with embodiments of the disclosed technology.

In a fourth aspect, embodiments of the disclosed technology relate to a processing device 700 comprising at least one majority gate device 200 and a clocking system 710 in accordance with embodiments of the disclosed technology. FIG. 7 shows the different components an exemplary processing device 700 in accordance with embodiments of the disclosed technology. This processing device comprises a circuit 500 comprising a plurality of majority gate devices

200. The cells of the circuit 500 are clocked by a clocking system 710. This clocking system comprises a first component 712 adapted for clocking the cells of the majority gate device. Thereby cells 210 are clocked to generate spin waves such that they interfere in the majority gate device 200 after propagating through the waveguide 230 and one or more other cells 210 are clocked to receive the interference of the spin waves. The clocking system 710 comprises a second component 714 adapted for clocking the cells such that a signal can propagate between different cells and/or such that a signal can be inverted. The clocking system 710 is adapted to control execution of logic functions by means of this first and second component.

If the cells 210 are not adjacent, clocking of the cells such that a signal can propagate between the different cells may be done using intermediate steps. Thereby the cells are clocked such that the signal can hop from one cell to another. Thereby each hop corresponds with a clock cycle. It may be that the transfer of the signal is not over cells in an inline configuration. However, the majority operation is over cells in an inline configuration. The output (i.e. the signal) of a majority operation can be transferred to another cell and can be used as an input for another majority operation. The clocking system may for example have a clock cycle of a few 100 MHz.

Logic functions can be implemented using such a processing device 700. Using logic mapping the clocking system 710 can be configured to clock the circuit 500 such that the logic functions are executed. The mapping takes into account the circuit configuration (i.e. the cells, how they are interconnected using the waveguides, how the majority gate devices can be clocked, and how the outputs of the majority gate devices can be transferred between cells in the circuit).

Circuits 500 according to embodiments of the present invention can for example be used to implement NAND or NOR or XOR or any other logic functions.

The logic functions may be implemented partly by the design of the circuit 500, and partly by the clocking system 710.

The circuit 500 may be designed such that some cells are interconnected to form majority gate devices 200, some cells 210 are interconnected to pass signals from one cell to another, and some cells are not interconnected such that spin waves cannot pass between these cells. In such a circuit design only the waveguides might be patterned which are required for the logic functions.

The clocking system 710 may clock only some specific cells to enable them such that they can generate spin waves or detect spin waves and the other cells are not enabled. Particular blocks of cells of the circuit may be disabled. By disabling them it is prevented that they are changed by passing spin waves.

The circuit 500 may be controlled and enabled in several ways. For controlling the sequence in which the cells are interacting (either to form a majority gate or a buffer/inverter) in the circuit one or more of the following things may be done:

Physically print only the desired parts of the circuit 500 and get rid of waveguides 230 that might induce 'sneak paths'
  a. Apply a blocking signal (this may for example be a voltage which prevents that the cell is affected by a passing spin wave) on cells 210 that should remain unchanged at each clocking cycle. This way it can be prevented that cells are affected which should not be affected.
  b. Fabricate the waveguides 230 and cells 210 of the circuit 500 with specific material characteristics such that certain cells can generate spin waves that propagate only (or mostly) in one direction (this can for example be the column direction or the row direction). Physically print an entire regular grid keeping all used and unused connections between cells
  a. Apply a blocking signal on cells 210 that should remain unchanged at each clocking cycle. This way it can be prevented that cells 210 are affected which should not be affected.
  b. Fabricate the waveguides 230 and cells of the circuit 500 with specific material characteristics such that certain cells can generated spin waves that propagate only (or mostly) in one direction (this can for example be the column direction or the row direction).

It is an advantage of embodiments of the present that a circuit which is adapted for performing a logic function has a smaller footprint than the same logic function in CMOS technology. As spin waves only use a limited amount of energy also reduced power consumption can be achieved compared to CMOS technology.

Figure 8:
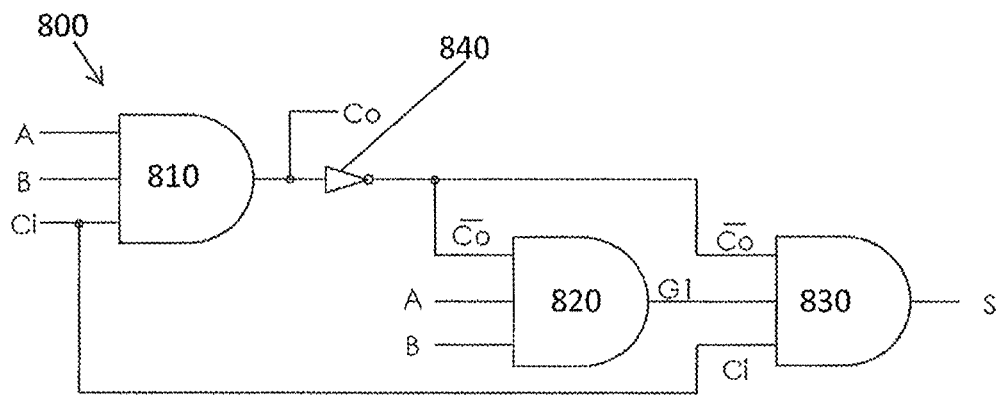
FIG. 8 shows a 1-bit full adder implemented with majority gates.

FIG. 8 shows a 1-bit full adder implemented with majority gates. The drawing shows a first majority gate 810, a second majority gate 820, a third majority gate 830 and an inverter 840. The 1-bit operands A and B and the 1-bit carry-in Ci are the inputs of the first majority gate 810. The output Co of the first majority gate 810 is connected with the inverter 840 and the output Co' of the inverter 840 is connected with an input of the second majority gate 820 and with an input of the third majority gate 830. The 1-bit operands A and B are connected with the other inputs of the second majority gate 820. The output G1 of the second majority gate 820 and the 1-bit carry-in Ci is connected with the other inputs of the third majority gate 830. The output of the third majority gate 830 is the summation result S.

Figure 9:
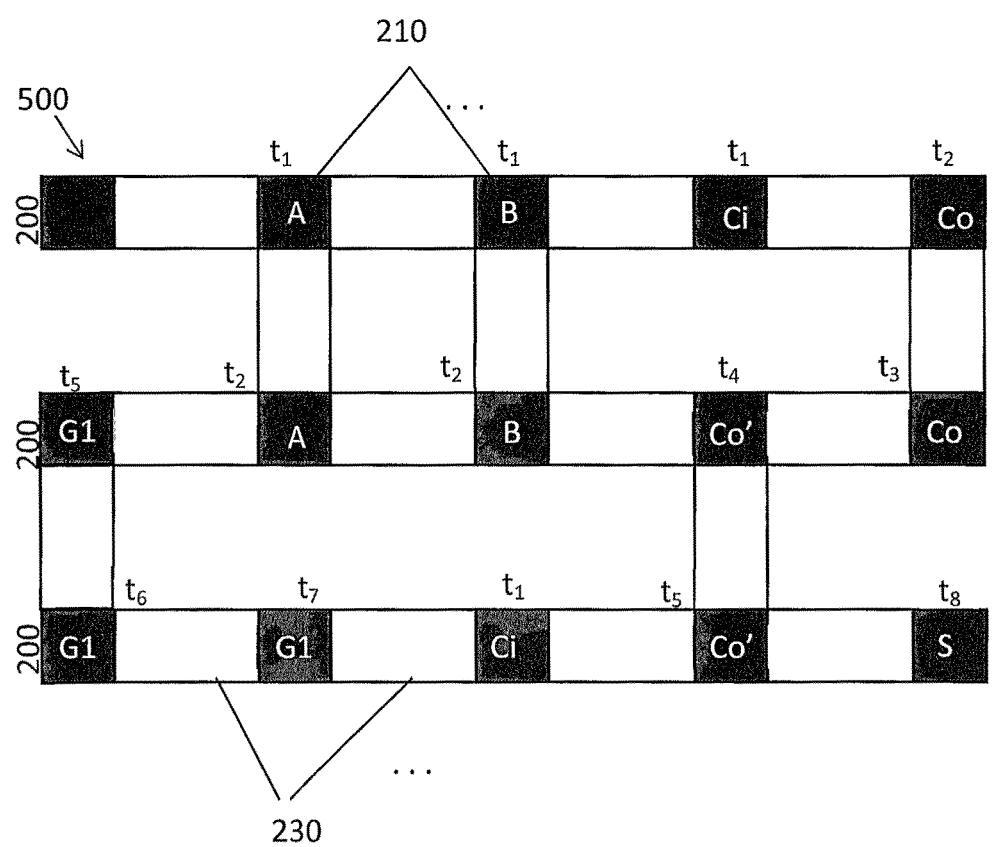
FIG. 9 shows a schematic drawing of a possible implementation of the 1-bit full adder of FIG. 8 in accordance with embodiments of the disclosed technology.

Such a 1-bit full adder can be implemented using a processing device 700 in accordance with embodiments of the disclosed technology. An exemplary circuit 500 which can be clocked by a clocking system such that it can execute the functionality of a 1-bit FA is illustrated in FIG. 9. FIG. 9 shows an example of a circuit in which not all cells 210 are interconnected by waveguides 230 in accordance with embodiments of the disclosed technology. In this circuit part of the connections are not present to prevent sneak paths. Each cell 210 that is not involved in an operation at each time point is held constant by a blocking signal generated by the clocking system. Each row in this example corresponds with a majority gate device 200. The first row corresponds with the first majority gate device 810 in FIG. 8, the second row with the second majority gate device in FIG. 8 and the third row with the third majority gate device in FIG. 8.

The clocking system in this exemplary embodiment of the disclosed technology is configured as follows:
  at moment t1 the inputs are set in the corresponding cells,
  at moment t2 the output Co is received and the signals A, B are propagated,
  at moment t3 the output Co is inverted,
  at moment t4 the inverted output Co' is propagated,
  at moment t5 the output G1 is received and the Co' is propagated,
  at moment t6 the output G1 is propagated,
  at moment t7 the output G1 is propagated,
  at moment t8 the summation result S is received.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A majority gate device, comprising:
    a waveguide and a plurality of cells, wherein each of the cells is arranged in an in-line configuration, and wherein each of the cells is a magneto-electric cell configurable as a spin wave generator or a spin wave detector;
    three or more of an odd number of the cells configured as spin wave generators, wherein the waveguide is configured to guide spin waves generated by the spin wave generators; and
    at least one of the cells configured as a spin wave detector, wherein the spin wave generators and the at least one spin wave detector are positioned such that, in operation, the at least one spin wave detector is configured to detect an interference of the spin waves generated by the spin wave generators, wherein the interference of the spin waves corresponds to a majority operation of the spin waves generated by the spin wave generators.

2. The majority gate device according to claim 1, wherein at least some of the cells are magnetic tunnel junctions.

3. The majority gate device according to claim 1, wherein one of the cells configured as a spin wave detector is formed at an end region of the waveguide.

4. The majority gate device according to claim 1, wherein at least two cells are configured as spin wave detectors.

5. The majority gate device according to claim 4, wherein two of the cells configured as spin wave detectors are formed at end regions of the waveguide and interposed by the cells configured as spin wave generators.

6. A circuit comprising a plurality of parallel majority gate devices according to claim 1.

7. The circuit according to claim 6, comprising a plurality of cells organized in rows and columns, wherein at least some of the cells are interconnected by waveguides, and wherein at least some of interconnected cells form majority gate devices extending in a row direction and/or a column direction.

8. A clocking system configured for clocking the cells of the majority gate device according to claim 1, wherein the clocking system comprises:
    at least one first component adapted for clocking the cells of the majority gate device,
    wherein some of the cells of the majority gate device according to claim 1 are clocked to generate spin waves such that they interfere in the majority gate device after propagating through the waveguide,
    wherein one or more of others of the cells of the majority gate device according to claim 1 are clocked to receive the interference of the spin waves, and
    wherein the clocking system is configured to control execution of logic functions using the at least one first component.

9. The clocking system according to claim 8, wherein the clocking system comprises at least one second component adapted for clocking the cells such that a signal propagates between different cells, and/or such that a signal is inverted, and wherein the clocking system is configured to control execution of logic functions by using the at least one first component and the at least one second component.

10. A processing device comprising a majority gate device according to claim 1, the processing device further comprising a clocking system, the clocking system comprising:
    at least one first component adapted for clocking the cells of the majority gate device,
    wherein some of the cells of the majority gate device according to claim 1 are clocked to generate spin waves such that they interfere in the majority gate device after propagating through the waveguide,
    wherein one or more of others of the cells of the majority gate device according to claim 1 are clocked to receive the interference of the spin waves, and
    wherein the clocking system is configured to control execution of logic functions using the at least one first component.

11. The processing device according to claim 10, wherein the processing device is configured as a node in an internet of things.

12. The majority gate device of claim 1, wherein the plurality of cells are arranged in a straight line.

* * * * *